May 16, 1961 R. L. HENRY 2,984,768

CIRCUIT PANEL ASSEMBLIES

Filed June 1, 1955

2 Sheets-Sheet 1

INVENTOR
ROBERT L. HENRY

BY Hart, Shields & Price

ATTORNEYS

May 16, 1961 R. L. HENRY 2,984,768

CIRCUIT PANEL ASSEMBLIES

Filed June 1, 1955 2 Sheets-Sheet 2

INVENTOR.
Robert L. Henry
BY
Hart, Shields & Price
Attorneys

United States Patent Office 2,984,768

Patented May 16, 1961

2,984,768

CIRCUIT PANEL ASSEMBLIES

Robert L. Henry, Silver Spring, Md., assignor, by mesne assignments, to Illinois Tool Works, Chicago, Ill., a corporation of Illinois Filed June 1, 1955, Ser. No. 512,526

8 Claims. (Cl. 317—101)

This is a continuation-in-part of my copending application, Serial No. 447,144, filed August 2, 1954, and now abandoned.

As used herein the term printed circuit means an electrical circuit with or without its component elements which is produced by one or more of the mechanical, thermal, or chemical methods used for developing a circuit array as a unified pattern. This is a generic term intended to include a number of expressions which are more specific with regard to the processing method used. Among these latter are: processed circuits, etched circuit, plated circuit, sprayed circuit, stamped circuit or embossed circuit.

The invention disclosed herein utilizes a printed circuit panel in its preferred embodiment, the circuit panel having an opening formed therein which may accommodate an electrical part or component, for example a tube socket. When it is the desire to secure a component to a printed circuit panel the present practice requires the leads to be soldered directly thereto or to be passed through apertures in the panel and then soldered.

In connection with mass production of electronic equipment the modular technique has been developed, one type of module consisting of a plurality of ceramic wafers or plates arranged parallel to each other and held fixed together by means of conductive riser wires piercing the edges of the ceramic plate and soldered thereto. The purpose of the stack of plates is to provide surfaces on which to accommodate components, and the wires are to afford conductors to which external wiring may be conducted, and also to act as mechanical supports for the ceramic plates. The module is an easily handled unit and has considerable versatility. Obviously it may have any number of plates and any number of conductive wires depending on the number and kind of components to be supported and the particular application of the unit. However, an important detail of the module is a fact that a large number of wires, usually 12, extend from one end thereof. Their spacing is fixed by being soldered in the module plates, and accordingly an opening may be formed in the printed circuit panel of such size and configuration that the wires are loosely accommodated and are easily inserted therethrough simultaneously; but the opening is so formed that the module plates do not pass through but instead the superior module plate engages against the edges of the panel in abutting relationship. Since the aperture formed in the panel has been arranged to interrupt selected ones of the printed conductors thereon the method of connecting the module risers is to bend them back upon themselves whereby they interlock against the edges of the panel and engage the interrupted conductors whereby to connect into selected circuits the components supported on the plate. Soldering or bonding of the ends of the riser wires to the interrupted conductors completes the installation and the module is firmly held mechanically to the panel and is connected electrically into the printed circuit.

It is accordingly an object of this invention to provide a new panel structure and to teach a new method of connecting a module to a printed circuit panel.

It is another object of this invention to form an aperture of such dimensions in printed circuit panels that module wires extending from the ends thereof fit loosely in the opening.

It is a further object of this invention to improve on the electrical assembly methods now in use.

It is yet another object of this invention to provide a method of mechanically and electrically connecting a module into a circuit printed on a plurality of spaced panels.

It is a further and more distinct object of this invention to provide a method as a series of exact steps whereby a square aperture is formed in a circuit panel and a module is connected thereto by passing the riser conductors through the aperture and interlocking them with the aperture edges.

Other objects and advantages will be in part obvious and in part pointed out in the following specification taken in connection with the drawing in which.

Figures 1, 2, 4, 5:
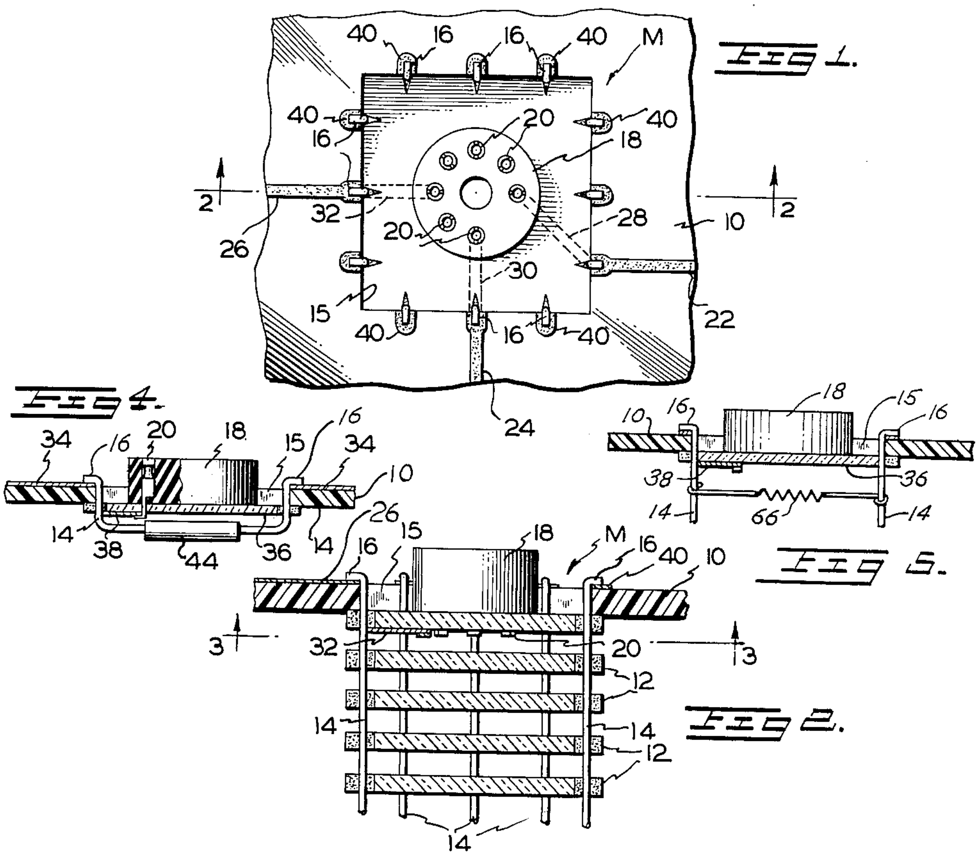
Figure 1 is a fragmentary plan view of a printed circuit panel to which a module is secured.
Figure 2 is a longitudinal elevation in section taken substantially on the lines 2—2 of Figure 1 and looking in the direction of the arrows.
Figure 4 is an elevation in section taken on lines 4—4 of Figure 6 and showing a modification of the invention.
Figure 5 is an elevation in section of another arrangement of the species of Figure 4.
Figure 3:
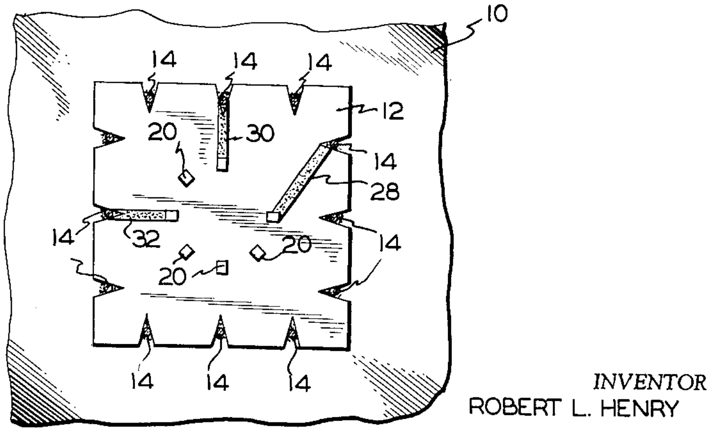
Figure 3 is a section view taken on the lines of 3—3 of Figure 2 and looking in the direction of the arrows.

Referring now to the drawing wherein like reference characters designate like or corresponding parts throughout, a module M, is illustrated in Figures 1, 2 and 3 to consist of a plurality of wafers or plates, 12, held in spaced apart relation by a number of conductive wires or leads, 14. As is best seen in Figure 3 the wires are disposed in piercing relation at the edges of the plate and are bonded thereto. A printed circuitry panel, 10, is provided for electrically interconnecting stages represented by the module, and for physically supporting the same. In order to connect the module to panel 10 quickly and easily an aperture 15 is formed in the panel of an area slightly smaller than the area of the module wafers and arranged to interrupt selected printed panel circuits. As seen in Figure 1 the aperture formed in the panel is of substantially square configuration to conform to the wafer shape. If the module is constructed as a sub-assembly and a socket, 18 is mounted on the superior wafer thereof such sub-assembly can be quickly and easily secured to the panel by a novel method, as will now be explained.

The plurality of conductive riser leads 14 are simultaneously inserted through the square aperture so that they all extend upward and the superior wafer abuts against the edges of the panel, as seen in Figure 2. The riser wires or leads 14 are bent back upon themselves to form feet, designated by reference character 16, whereby such feet interlock with the edges of the aperture and engage the interrupted printed circuitry. The terminated end of the leads 14 are then bonded or otherwise firmly secured to the panel and to the circuit paths and the module is fixed in place.

The wafers of module, M may contain a large number of components such as transistors, condensers or impedances, in which case the majority of the riser wires, possibly all of them may be required for external circuit connection. It should be mentioned that a number of the risers or leads may be interrupted at the portions extending between adjacent wafers to thereby isolate any desired component or to interconnect the same on the wafer without unduly diminishing the mechanical strength of the assembly. In some instances only two or three risers or leads will be used for external connection through the conductors on the circuit panel. One of the simpler constructions is here illustrated wherein socket 18 is to accommodate a half wave rectifier tube. The socket conductors 20 extend through small holes in the superior wafer as will be seen in Figure 3 and are bent and connected to the proper riser wire through conductive paths printed on the underside of such superior wafer. Conductive path 28 interconnects between one of the socket contacts and a riser; as do respective conductive paths 30 and 32. The necessary tube resistors and circuit parameters (not shown) are supported on the wafer surfaces and connected to the proper leads 14. It will thus be readily seen that if the tube be inserted in the socket the circuitry is complete and conductive paths 22, 24 and 26 on the panel and interrupted by aperture 15 interconnects the stage represented into other stages of an electronic circuit. It will be appreciated that this explanation is for purposes of illustration only and the exact details of the vacuum tube mentioned are not material; the general purpose being merely to show how a tube and its associated socket is supported on a module body and connected into a printed circuit by the above disclosed method.

The interrupted panel circuitry is arranged to terminate in outwardly flaring paths at the edge of the aperture substantially as is shown in Figure 1. This additional area is provided to permit ready engagement of the bent back feet portions of the risers or leads 14 and to allow for variations in assembly when automatic machinery is used for this construction. Where no circuits are present at the aperture edges metallic pads 40 are formed on the panel to receive the feet 16.

Figure 6:
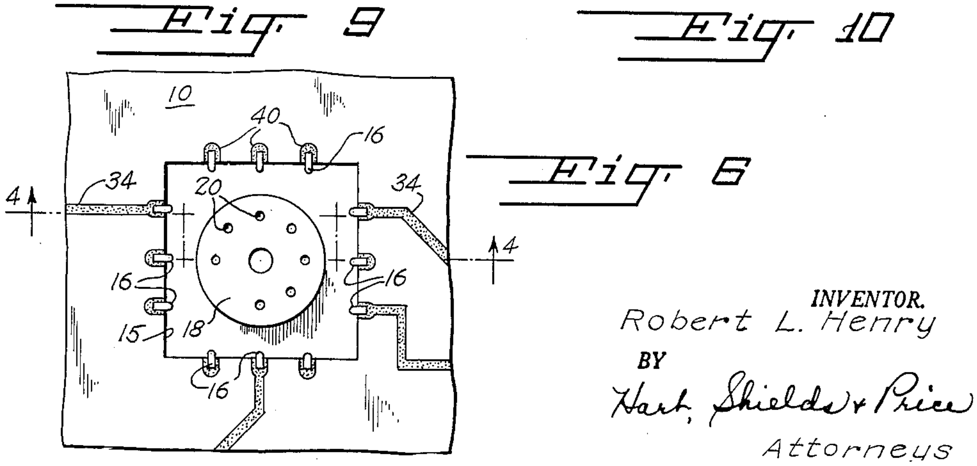
Figure 6 is a fragmentary plan view of the modification of Figure 4.

Figures 4 and 6 illustrate a modification wherein circuit panel 10 has an aperture 15 formed therein together with a circuit pattern having a conductor 34 interrupted by the aperture. Plate 36 is similar to the superior wafer of the module M and is sufficiently large to contact in covering relationship the aperture in the surface of the panel in a manner identical to the engagement of the wafer. Socket 18 on the plate has its contacts connected by conductive paths such as 38, and the risers 14, are bent to connect with the conductors 34. This embodiment illustrates the fact that all of the risers need not be necessarily ordinary wires but that one or more may be pigtailed leads of a component 44 secured in the edge notches of a plate intermediate therein and bent over to form feet 16 upon the surface of the panel. The bent terminal portions of the wire leads are of course soldered or otherwise bonded to the circuit paths on the panel. Obviously any number of components may be thus secured and supported by the other vertical wire portions whose bent-over feet are shown in Figure 6. It will be apparent also that as the circuit design demands one or more of the vertical wire portions may be omitted.

The embodiment of Figure 5 shows a printed circuit panel 10 containing an aperture 15 under which a plate 36 is supported. Plate 36 is identical in all respects to the plate of Figure 4 and supports a tube socket 18 and conductive paths 38. Note, however that wires 14 in this embodiment are not parts of a component but are separate leads. These leads are connected to the plate 36 by any convenient method for example, soldering, and have straight portions which are approximately parallel, together with right angular feet 16 which rest on the top surface of panel 10 and are fixed thereto. An advantage of using wires 14 is the fact that they may be of indefinite length. In this way an impedance element such as 66 may be secured theerto, together with any practical number of other components.

Figure 7:
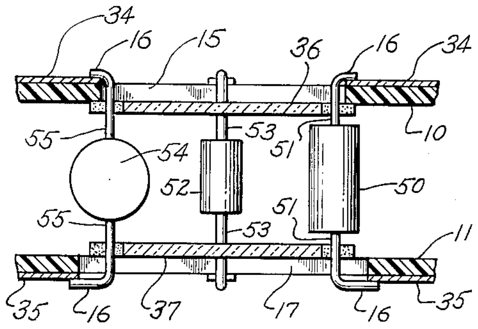
Figure 7 is an elevation in section of still another modification of the invention.

The modification of Figure 7 discloses a plurality of parallel spaced panel members 10 and 11 respectively carrying printed circuit arrays 34 and 35. A component to be joined between the panels and to be connected to the circuits is constructed as a sub-assembly and consists of two wafers 36 and 37 disposed in spaced relation and carrying therebetween a plurality of electrical units. In this case a resistor 50 having leads 51, a condenser 52 having leads 53 and an impedance coil 54 having leads 55 are shown for the purposes of exemplification of the invention. The several units are mounted as shown with their respective pigtail leads piercing the wafers at the outer extremities thereof and secured thereto. Panel 10 has formed therein an aperture 15 of smaller area than the superior wafer and panel 11 has an aligned aperture 17 formed therein of an area larger than the wafers to permit passage therethrough. Both apertures interrupt selected circuit conductors as required. It will be seen that the assembly constructed as described can be passed through aperture 17 but the top wafer 36 will not pass through aperture 15 but abuts against the plate in facing relation and boundary engagement between such wafer and the panel at the edges of the aperture results, with the lead assemblages extending through both aperture. The final step in the assembly method is to turn back the several groups of leads to form feet, 16 which interlock with the panel at the edges of the apertures and engage the interrupted circuitry, substantially as described in the preceding embodiments. Obviously any desired circuitry may be placed on the upper or lower panel and the component above described will be used to interconnect the same in any desired electrical configuration. The component thus described provides a mechanical connection between the several panels sufficient to hold itself in place and at least in part maintain the panels in their properly spaced relationship.

Figure 8:
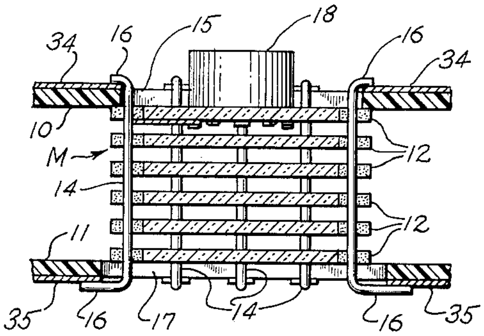
Figure 8 is an elevation in section of yet another modification of the invention.

Figure 8 shows a modified embodiment where the module M, consisting of juxtaposed parallel square wafers 12 held in spaced relationship by conductive strands 14 and carrying a tube socket 18, is constructed as a subassembly and used to interconnect spaced apart panels 10 and 11 carrying thereon circuit arrays 34 and 35 respectively. An aperture 15 of an area smaller than the wafers 12 and of substantially square configuration is formed in the upper panel 10 to conform to the general shape of the wafers, although it will be understood that the exact configuration of the aperture is variable depending on the requirements of the particular situation. An aperture 17 of substantially square configuration and larger than the wafer area is formed in the lower panel 11 and aligned with aperture 15. The method of assembling this organization is similar to the species of Figure 7 in that the completed module, having its component thereon and the riser wires 14 extending therefrom, is passed through the lower aperture 17 so that it extends between the upper and lower panel in general sandwiched relationship with the assemblages of strands extending through both apertures. The strands are then bent back upon themselves to form feet 16, substantially as shown, which interlock with the panels at the edges of the apertures and engage the pre-selected circuit conductors, 34 and 35. The final step in the assembly method is to solder or otherwise securely bond the feet 16 to the circuitry conductors or pads.

Figure 9:
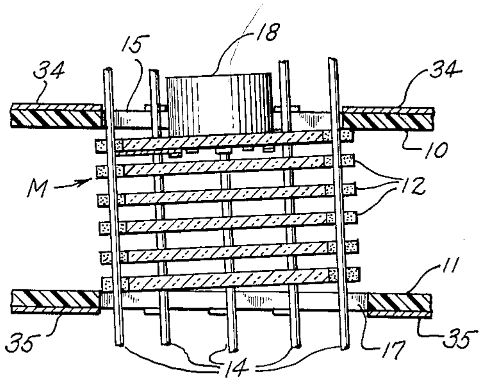
Figures 9 and 10 are elevations in section illustrating assembly steps of yet still another modification.
Figure 10:
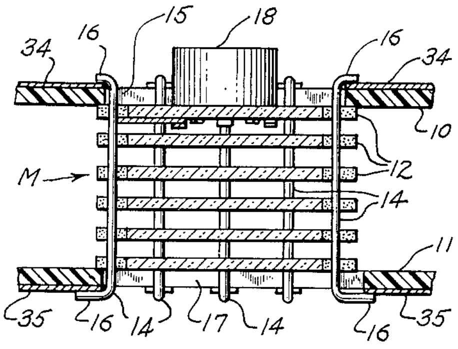

Figures 9 and 10, taken together, show a modification of the invention wherein all module structural details are the same as described in the species of Figure 8 except that the several apertures 15 and 17 are not aligned as previously described. One edge of aperture 17 is in registry with an edge of aperture 15 and the opposite edge thereof extends beyond its counterpart. The module will pass through aperture 17 if it is tilted slightly so that it forms an acute angle with the planes of the respective panels, as shown in Figure 9. By rotating the module through a small arc to the vertical position after the angular insertion the lower surface of the bottom wafer comes to rest upon the upper surface of panel 11 substantially as shown. The resilience of the module structure makes this operation possible. The final steps, then, are to bend the strands into edge engaging feet 16 and to bond the same in position by soldering or like process.

While I have described certain embodiments of my invention, other variations in detail will readily occur to those skilled in the art and accordingly it is understood that the described embodiments are illustrative only and not to be construed in a limiting sense.

I claim:

1. The method of mounting a circuit component to a dielectric circuit panel having a conductive strip on one surface thereof, said method comprising the steps of forming an aperture through said dielectric panel with said conductive strip thereon terminating at said aperture, fixing said circuit component to a flat dielectric wafer, fixing a plurality of metallic leads to said dielectric wafer with end portions of said leads extending from said wafer, conductively joining said circuit component to at least one of said leads, fixing said wafer to said dielectric panel on the side of said panel away from said one panel surface and with said end portions of said leads extending through said aperture, bending said end portions of said leads into contact with said one surface of said panel, and conductively joining the end portion of said one lead to said conductive strip.

2. The method of mounting a circuit component to a dielectric circuit panel having conductive coatings on one surface thereof, said method comprising the steps of forming an aperture through said dielectric panel with said conductive coatings thereon terminating at said aperture, fixing said circuit component to a flat dielectric wafer having a surface with dimensions larger than said aperture, fixing a plurality of conductive leads to said dielectric wafer with end portions of said leads extending from said wafer surface, conductively joining said circuit component to one of said conductive leads, fixing said wafer to said dielectric panel by positioning said surface of said wafer across said aperture of said dielectric panel on the side of said dielectric panel opposite to said one panel surface and with said end portions of said conductive leads extending through said aperture, bending said end portions of said conductive leads into contact with said one surface of said panel, and conductively joining the end portion of said one lead to one of said conductive circuit coatings.

3. The method of mounting a circuit component to a dielectric circuit panel having conductive strips on one surface thereof, said method comprising the steps of forming an aperture through said dielectric panel with said conductive strips thereon terminating at said aperture, fixing said circuit component to a flat dielectric wafer having a surface with dimensions larger than said aperture, fixing a plurality of metallic leads to said dielectric wafer with end portions of said leads extending from said wafer surface, conductively joining said circuit component to a pair of said plurality of metallic leads, fixing said wafer to said dielectric panel by positioning said surface of said wafer against the surface of said dielectric panel opposite to said one panel surface so as to at least partially close over said aperture with said wafer and with said end portions of said leads extending through said aperture, bending said end portions of said metallic leads into contact with said one surface of said panel, and conductively joining the end portion of each one of said pair of metallic leads to a different one of said conductive circuit strips.

4. The method of mounting a vacuum tube socket to a dielectric circuit panel having conductive coatings on one surface thereof, said method comprising the steps of forming an aperture through said dielectric panel with said conductive coatings thereon terminating at said aperture, fixing said tube socket to a surface of a flat dielectric wafer, said wafer surface having dimensions larger than said aperture, fixing a plurality of metallic leads to said dielectric wafer with end portions of said leads extending outwardly from said wafer surface, conductively joining conductors of said tube socket to said leads, fixing said wafer to said dielectric panel by positioning said surface of said wafer against the surface of said dielectric panel opposite to said one panel surface and with said end portions of said leads and said tube socket extending through said aperture, bending said end portions of said leads into contact with said one surface of said panel, and conductively joining the end portion of each of said leads to a different one of said conductive coatings.

5. An electrical assembly comprising a pair of spaced dielectric circuit panels each having an aperture therethrough and a coating of electrically conductive material on one surface of one of said circuit panels and terminating adjacent to said aperture of said one circuit panel, a circuit component structure, means mounting said circuit component between said spaced circuit panels, said mounting means including a plurality of metallic conductors fixed to and extending from said component structure between said spaced panels and having end portions thereof extending through said apertures, means electrically connecting said circuit component structure to one of said metallic conductors, an end portion of said one metallic conductor conductively fixed to said conductive coating.

6. An electrical assembly comprising a pair of spaced circuit panels each having an aperture therethrough and a coating of electrically conductive material on one surface of one of said circuit panels and terminating adjacent to said aperture of said one circuit panel, a circuit component, means mounting said circuit component between said spaced circuit panels, said mounting means including an insulating plate between said spaced circuit panels and a plurality of metallic conductors fixed to said insulating plate and having end portions thereof extending through said apertures and being bent into contact with the outer surfaces of said spaced circuit panels, means electrically connecting said circuit component to one of said metallic conductors, an end portion of said one metallic conductors being conductively connected to said conductive coating.

7. An electrical assembly comprising a pair of spaced circuit panels each having an aperture therethrough and a coating of electrically conductive material on one surface of each of said circuit panels and terminating adjacent to said respective apertures thereof, a plurality of insulating plates, means mounting said insulating plates between said spaced circuit panels, said mounting means including a plurality of metallic conductors fixed to each one of said insulating plates and extending between said insulating plates to space said insulating plates from each other, said metallic conductors having end portions thereof extending through said apertures of said circuit panels and being bent into contact with the outer surfaces of said spaced circuit panels, a circuit component fixed to one of said insulating plates and conductively connected to a pair of said metallic conductors, said end portions of said pair of metallic conductors each being conductively fixed to a different one of said coatings of conductive material.

8. An electrical assembly comprising a pair of spaced circuit panels each having an aperture therethrough, said circuit panels overlying one another with said apertures therethrough in alignment, a plurality of spaced insulated coatings of electrically conductive material on the outer surfaces of each of said spaced panels, said coatings each terminating adjacent to a respective one of said apertures, a plurality of plates of insulating material spaced from each other between said pair of circuit panels, means mounting said insulating plates to said spaced circuit panels with one of said insulating plates fixed against the inner surface of one of said circuit panels and extending across said aperture thereof, said insulating plate mounting means including a plurality of metallic conductors fixed to the peripheral edges of each of said insulating plates, each of said metallic conductors having an end portion thereof extending through one of said apertures of said circuit panels, said end portion of said each one of said metallic conductors being bent over into contact with the outer surface of one of said circuit panels and conductively bonded to one of said plurality of conductive coatings thereon, a plurality of circuit components, means conductively joining said circuit components to said metallic conductors.

References Cited in the file of this patent

UNITED STATES PATENTS

| | | |
|---|---|---|
| 1,718,993 | Wermine | July 2, 1929 |
| 2,417,420 | Knapp | Mar. 18, 1947 |
| 2,599,710 | Hathaway | June 10, 1952 |
| 2,633,526 | Snyder | Mar. 31, 1953 |
| 2,668,932 | Kliever | Feb. 9, 1954 |
| 2,716,268 | Steigerwalt | Aug. 30, 1955 |
| 2,744,214 | Marco | May 1, 1956 |
| 2,774,014 | Henry | Dec. 11, 1956 |
| 2,790,961 | Del Camp | Apr. 30, 1957 |
| 2,802,995 | Mautone et al. | Aug. 13, 1957 |